(12) United States Patent
Sievenpiper

(10) Patent No.: US 6,864,848 B2
(45) Date of Patent: Mar. 8, 2005

(54) RF MEMS-TUNED SLOT ANTENNA AND A METHOD OF MAKING SAME

(75) Inventor: Daniel F. Sievenpiper, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 28 days.

(21) Appl. No.: 10/192,986

(22) Filed: Jul. 9, 2002

(65) Prior Publication Data

US 2003/0122721 A1 Jul. 3, 2003

Related U.S. Application Data

(60) Provisional application No. 60/343,888, filed on Dec. 27, 2001.

(51) Int. Cl.[7] .............................................. H01Q 13/10
(52) U.S. Cl. ........................ 343/767; 343/768; 343/770
(58) Field of Search .......................... 343/700 MS, 767, 343/768, 770, 876

(56) References Cited

U.S. PATENT DOCUMENTS

| | | | |
|---|---|---|---|
| 4,051,477 A | 9/1977 | Murphy et al. | 343/700 MS |
| 4,242,685 A | 12/1980 | Sanford | 343/770 |
| 4,308,541 A | 12/1981 | Seidel et al. | 343/786 |
| 4,367,475 A | 1/1983 | Schiavone | 343/767 |
| 4,370,659 A | 1/1983 | Chu et al. | 343/772 |
| 4,395,713 A | 7/1983 | Nelson et al. | 343/713 |
| 4,443,802 A | 4/1984 | Mayes | 343/729 |
| 4,590,478 A | 5/1986 | Powers et al. | 343/700 MS |
| 4,672,386 A | 6/1987 | Wood | 343/770 |
| 4,684,953 A | 8/1987 | Hall | 343/725 |
| 4,737,795 A | 4/1988 | Nagy et al. | 343/712 |
| 4,760,402 A | 7/1988 | Mizuno et al. | 343/713 |
| 4,803,494 A | 2/1989 | Norris et al. | 343/770 |
| 4,821,040 A | 4/1989 | Johnson et al. | 343/700 MS |
| 4,835,541 A | 5/1989 | Johnson et al. | 343/713 |
| 4,903,033 A | 2/1990 | Tsao et al. | 343/770 MS |
| 4,905,014 A | 2/1990 | Gonzalez et al. | 343/778 |
| 4,916,457 A | 4/1990 | Foy et al. | 343/770 |

(List continued on next page.)

FOREIGN PATENT DOCUMENTS

| | | |
|---|---|---|
| EP | 1 158 605 A1 | 11/2001 |
| FR | 2 785 476 | 5/2000 |
| GB | 2 281 662 | 3/1995 |
| GB | 2 328 748 | 3/1999 |
| WO | 99/50929 | 10/1999 |

OTHER PUBLICATIONS

Schaffner et al, "Reconfigurable aperture . . . beam steering", Jul. 16, 2000, IEEE, pp. 321–324.*

(List continued on next page.)

*Primary Examiner*—Tho Phan
(74) *Attorney, Agent, or Firm*—Ladas & Parry LLP

(57) ABSTRACT

A slot antenna for receiving and/or transmitting a RF signal at a desired one of a plurality of different frequencies. The slot antenna includes at least one conductive sheet having a slot defined therein, the slot being longer than it is wide and having at least one end which is open. A plurality of switch members are mounted along said slot close to the open end thereof, each of said plurality of switch members acting, when closed, to couple the at least one conductive sheet on one side of said slot to the at least one conductive sheet on a second side thereof. A feed point is provided for adjacent said slot. The plurality of switch members are closable in a controlled manner to change a desired resonance frequency at which the slot antenna receives and/or transmits the RF signal.

32 Claims, 10 Drawing Sheets

U.S. PATENT DOCUMENTS

| | | | |
|---|---|---|---|
| 4,922,263 A | 5/1990 | Dubost et al. | 343/797 |
| 4,958,165 A | 9/1990 | Axford et al. | 343/770 |
| 5,070,340 A | 12/1991 | Diaz | 343/767 |
| 5,158,611 A | 10/1992 | Ura et al. | 106/499 |
| 5,268,696 A | 12/1993 | Buck et al. | 342/372 |
| 5,287,116 A | 2/1994 | Iwasaki et al. | 343/700 MS |
| 5,402,134 A | 3/1995 | Miller et al. | 343/742 |
| 5,406,292 A | 4/1995 | Schnetzer et al. | 343/700 MS |
| 5,519,408 A | 5/1996 | Schnetzer | 343/700 |
| 5,532,709 A | 7/1996 | Talty | 343/819 |
| 5,541,614 A | 7/1996 | Lam et al. | 343/792.5 |
| 5,581,266 A | 12/1996 | Peng et al. | 343/770 |
| 5,892,485 A | 4/1999 | Glabe et al. | 343/789 |
| 5,905,465 A | 5/1999 | Olson et al. | 343/700 |
| 5,923,303 A | 7/1999 | Schwengler et al. | 343/853 |
| 5,929,819 A | 7/1999 | Grinberg | 343/754 |
| 5,943,016 A | 8/1999 | Snyder et al. | 343/700 MS |
| 5,949,382 A | 9/1999 | Quan | 343/767 |
| 5,966,096 A | 10/1999 | Brachat | 343/700 MS |
| 5,966,101 A | 10/1999 | Haub et al. | 343/767 |
| 6,005,521 A | 12/1999 | Suguro et al. | 343/700 MS |
| 6,008,770 A | 12/1999 | Sugawara | 343/767 |
| 6,028,561 A | 2/2000 | Takei | 343/767 |
| 6,034,644 A | 3/2000 | Okabe et al. | 343/767 |
| 6,046,655 A | 4/2000 | Cipolla | 333/137 |
| 6,061,025 A | 5/2000 | Jackson et al. | 343/700 MS |
| 6,081,239 A | 6/2000 | Sabet et al. | 343/753 |
| 6,118,410 A | 9/2000 | Nagy | 343/713 |
| 6,150,989 A | 11/2000 | Aubry | 343/767 |
| 6,188,369 B1 | 2/2001 | Okabe et al. | 343/767 |
| 6,198,438 B1 | 3/2001 | Herd et al. | 343/700 MS |
| 6,198,441 B1 | 3/2001 | Okabe et al. | 343/702 |
| 6,204,819 B1 | 3/2001 | Hayes et al. | 343/702 |
| 6,218,997 B1 | 4/2001 | Lindenmeier et al. | 343/725 |
| 6,307,519 B1 * | 10/2001 | Livingston et al. | 343/767 |
| 6,373,349 B2 * | 4/2002 | Gilbert | 333/126 |
| 6,388,631 B1 * | 5/2002 | Livingston et al. | 343/767 |
| 6,392,610 B1 * | 5/2002 | Braun et al. | 343/876 |
| 6,417,807 B1 * | 7/2002 | Hsu et al. | 343/700 MS |
| 2001/0035801 A1 * | 11/2001 | Gilbert | 333/126 |

OTHER PUBLICATIONS

Chen, Q., et al., "FDTD diakoptic design of a slop–loop antenna excited by a coplanar waveguide," *Proceedings of the 25th European Microwave Conference 1995*, vol. 2, Conf. 25, pp 815–819 (Sep. 4, 1995).

Schaffner, J., et al., "Reconfigurable Aperture Antennas Using RF MEMS Switches for Multi–Octave Tunability and Beam Steering," *IEEE Antennas and Propagation Society International Symposium, 2000 Digest*, vol. 1 of 4, pp 321–324 (Jul. 16, 2000).

Balanis, C., "Aperture Antennas," *Antenna Theory, Analysis and Design*, 2nd Edition, Ch. 12, pp 575–597 (1997).

Balanis, C., "Microstrip Antennas," *Antenna Theory, Analysis and Design*, 2nd Edition, Ch. 14, pp 722–736 (1997).

Cognard, J., "Alignment of Nematic Liquid Crystals and Their Mixtures," *Mol. Cryst. Liq., Cryst. Suppl. 1*, pp 1–74 (1982).

Doane, J.W., et al., "Field Controlled Light Scattering from Nematic Microdroplets," *Appl. Phys. Lett.*, vol. 48, pp 269–271 (Jan. 1986).

Jensen, M.A., et al., "EM Interaction of Handset Antennas and a Human in Personal Communications," *Proceedings of the IEEE*, vol. 83, No. 1, pp 7–17 (Jan. 1995).

Jensen, M.A., et al., "Performance Analysis of Antenas for Hand–held Transceivers Using FDTD," *IEEE Transactions on Antennas and Propagation*, vol. 42, No. 8, pp 1106–1113 (Aug. 1994).

Linardou, I., et al., "Twin Vivaldi antenna fed by coplanar waveguide," *Electronics Letters, GB, IEE Stevenage*, vol. 33, No. 22, pp 1835–1837 (1997).

Perini, P., et al., "Angle and Space Diversity Comparisons by the Fourier Transform Method," *IEEE Transactions on Antennas and Propagation*, vol. 46, No. 6, pp 764–775 (Jul. 1998).

Ramo, S., et al., *Fields and Waves in Communication Electronics*, 3rd Edition, Sections 9.8–9.11, pp 476–487 (1994).

Sievenpiper, D., et al., "High–Impedance Electromagnetic Surfaces with a Forbidden Frequency Band," *IEEE Transactions on Microwave Theory and Techniques*, vol. 47, No. 11, pp 2059–2074 (Nov. 1999).

Sievenpiper, D., et al., "High–Impedance Electromagnetic Surfaces," *Ph.D. Dissertation*, Dept. Of Electrical Engineering, University of California, Los Angeles, CA, 1999.

Vaughan, R., "Spaced Directive Antennas for Mobile Communications by the Fourier Transform Method," *IEEE Transactions on Antennas and Propagation*, vol. 48, No. 7, pp 1025–1032 (Jul. 2000).

Wu, S.T., et al., "High Birefringence and Wide Nematic Range Bis–tolane Liquid Crystals," *Appl. Phys. Lett.*, vol. 74, No. 5, pp 344–346 (Jan. 1999).

* cited by examiner

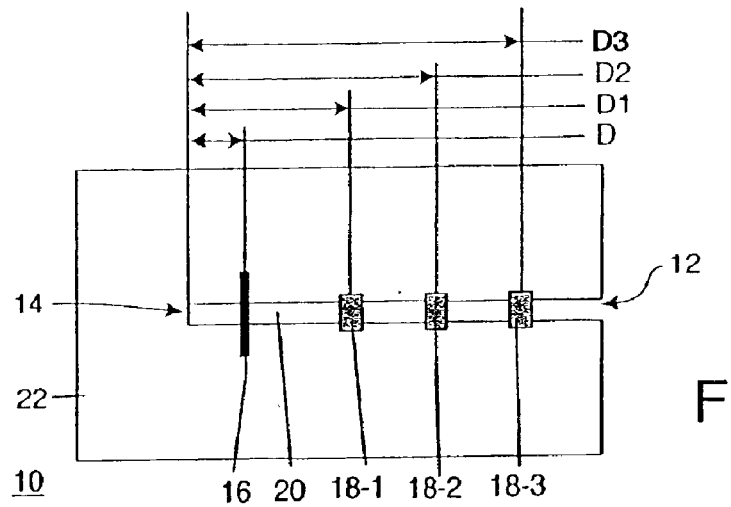
Figure 1
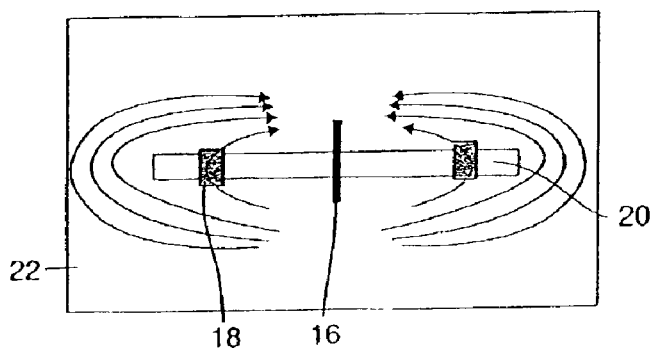
Figure 2
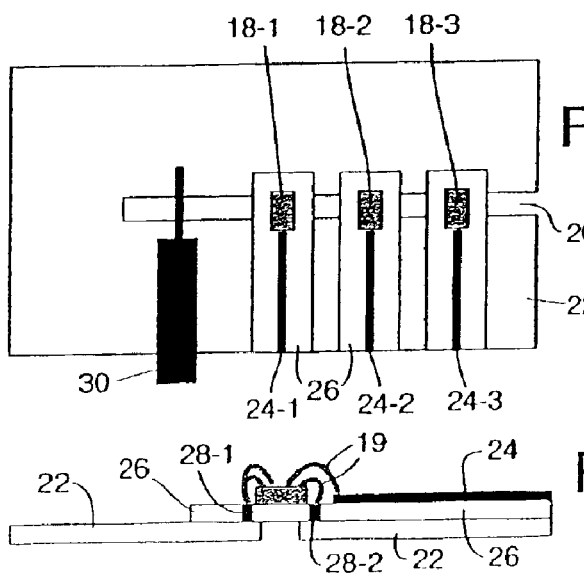
Figure 3A
Figure 3B
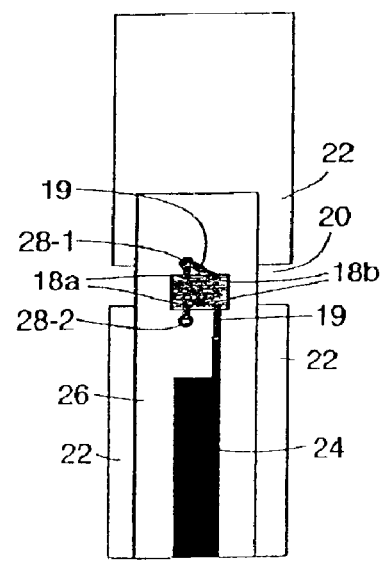
Figure 3C

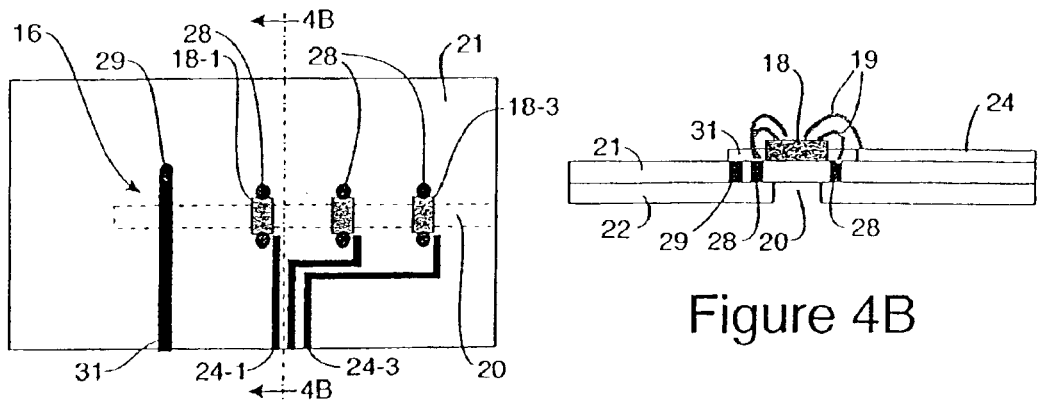
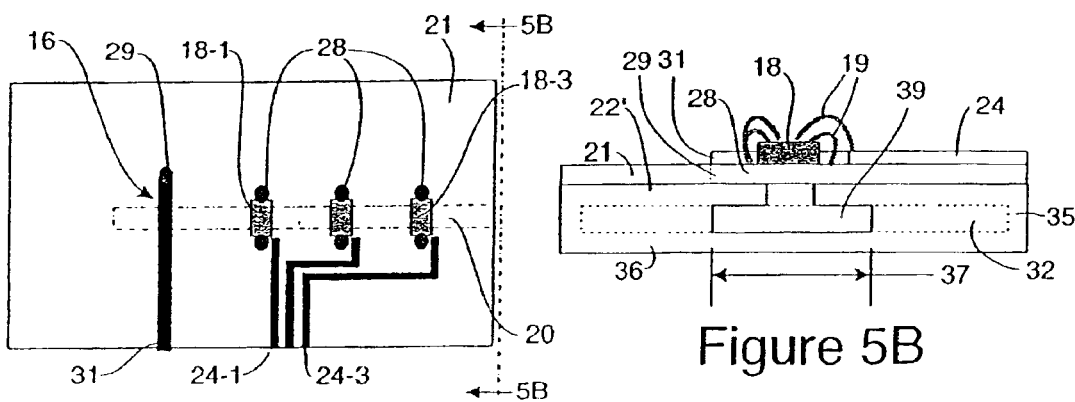
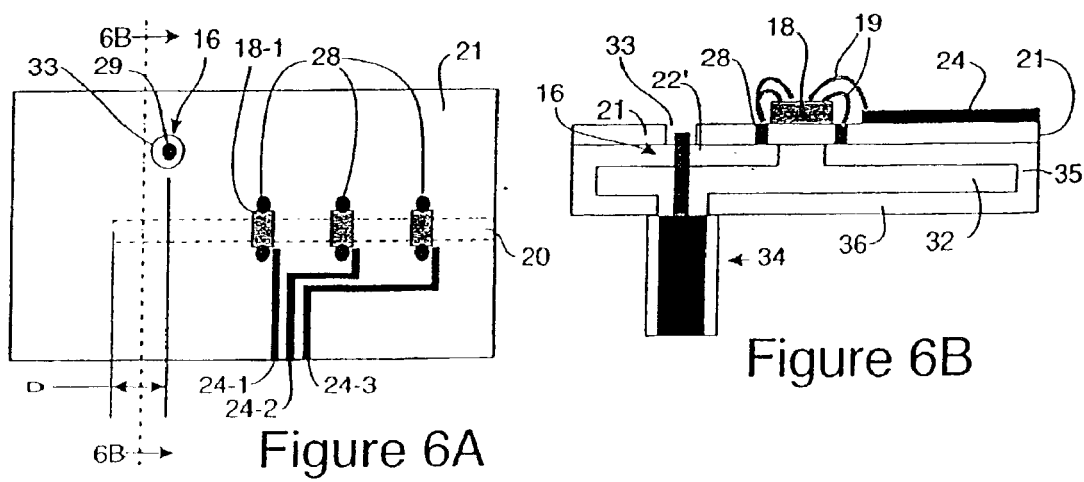

US 6,864,848 B2

RF MEMS-TUNED SLOT ANTENNA AND A METHOD OF MAKING SAME

CLAIM OF BENEFITS OF PROVISIONAL APPLICATION

Applicants claim the benefits of their co-pending U.S. Provisional application Ser. No. 60/343,888, filed on 27 Dec. 2001.

TECHNICAL FIELD

This invention relates to the field of tunable antennas using RF MEMS switches. It includes an open ended, (and possibly) cavity backed slot antenna, which has one or more RF MEMS switches to provide a variety of functions. Depending on the particular design of the antenna, the switches can be used to perform frequency tuning, to adjust the radiation pattern (as in switched-beam diversity), to adjust the polarization, or to adjust the phase of the radiated wave for phased array applications.

BACKGROUND OF THE INVENTION

Prior art tunable antennas utilizing MEMS switches include tunable dipoles (which suffer from interference from the DC bias lines for the MEMS switches), ordinary slot antennas (which suffer from limited tunability due to the low-impedance current path around the outside of the slot), and patch antennas (which suffer from limited tunability due to the difficulty of detuning an extended resonant structure by a significant amount without significant design difficulty, as well as problems from MEMS switch DC bias line interference). In one aspect, the present invention employs a single open end on a slot and allows the RF MEMS switches arranged near the open end to provide the greatest amount of tunability because the lack of alternative current paths forces the entirety of the antenna current through a closed MEMS switch. Also, the asymmetric design which may be achieved only requires half as many RF MEMS switches as competing geometries, thus lowering the cost and complexity of the antenna.

The present invention provides a simple way to accomplish several functions that are becoming more important as RF devices continue to become more complex. Cellular telephone manufacturers and RF system designers have already identified antenna diversity as an important addition to future wireless systems, in both the cellular handset and the base station. One way to accomplish this is to switch between several separate antennas. Another way, which is addressed in this disclosure, is to use a single antenna, and to reconfigure that antenna into multiple modes, allowing the apparatus to switch among these modes. This can result in a simpler design that takes up less space, an important consideration especially for the handset application.

The present invention provides a simple antenna that can switch among several different modes through the use of RF MEMS switches. It can provide control over the frequency, pattern, and polarization with a minimum number of switches, in a manner that is simple to design and to manufacture. It also has several advantages over existing alternatives, such as eliminating interference from DC bias lines for the MEMS switches, and having tunability over a broad frequency range. The use of this antenna as part of a diversity transceiver can provide several decibels of improved signal/noise ratio. The antenna geometries presented here have the advantage that they accomplishes this task with a minimum complexity and volume and provide control over a wide variety of antenna properties including frequency, polarization, and pattern.

This invention is applicable to the field of tunable antennas in general, as well as two types of antenna diversity (pattern and polarization). The disclosed antenna can be used in several applications, including automotive communication systems and military communication systems. As cars are beginning to require a greater number of services (onstar, gps, PCs, amps, sdars, etc.) the antenna requirements are becoming increasingly stringent. The use of antenna diversity is already recognized by cellular handset designers as an important advantage and a good way of improving the link budget. Cars, with their increased real estate, are a perfect candidate to take advantage of these new techniques to improve reliability and/or bandwidth. Another possible application is software radio, in which the military is making significant investments as the future solution to all communication needs.

The prior art includes:

(1). Ken Takei, "Tunable Slot Antenna", U.S. Pat. No. 6,028,561, Feb. 22, 2000, assigned to Hitachi. This antenna consists of a folded, U-shaped slot antenna which is built within a cavity. It is fed from a point in the center of the U-shape by an internal microstrip-like structure which causes a field across the center of the slot. It contains a tunable capacitance by means of a varactor diode, which is connected at the feed point. By applying a DC bias to the varactor, one may tune its capacitance, and thus adjust the input impedance of the antenna. This tunes the frequency where the antenna is matched. The antenna disclosed herein is different from this one in that it uses conductive, metal to metal contact MEMS switches to perform the tuning function. Since varactors can be lossy, the low loss of the MEMS devices provides an efficiency advantage. Furthermore, our design allows the antenna to have a variety of configurations for tuning the radiation pattern or the polarization, as will be explained below.

(2). Hiroshi Okabe, Ken Takei, "Tunable Slot Antenna with Capacitively Coupled Island Conductor for Precise Impedance Adjustment", U.S. Pat. No. 6,034,644, Mar. 7, 2000, assigned to Hitachi. This design is very similar to Takei's original design (See Ref(1)), but he has moved the varactor to within the slot, and added another branch to the slot. The disclosed antenna still has the same advantages as in the previous case.

(3). Hiroshi Okabe, Ken Take, "Tunable Slot Antenna with Capacitively Coupled Island Conductor for Precise Impedance Adjustment", U.S. Pat. No. 6,188,369, Feb. 13, 2001, assigned to Hitachi. This design is nearly identical to the previous patent by the same authors. Our antenna still has the same advantages as in the previous case.

(4). Hiroshi Okabe, Ken Take, "Wireless Handset", U.S. Pat. No. 6,198,441, Mar. 6, 2001, assigned to Hitachi. This patent describes a method of tuning a handset antenna to the frequency on which a call is being placed. The tuning function is controlled by the phone circuitry so that it will intelligently synchronize the antenna frequency with the frequency of the present telephone call. However, modern cellular telephones use spread spectrum techniques, so this type of design is not particularly useful. In the present design, one can not only switch bands, but one can also switch the radiation pattern or the polarization.

(5). Robert Snyder, James Lilly, Andrew Humien, ""Tunable Microstrip Patch Antenna and Control System Therefore", U.S. Pat. No. 5,943,016, Aug. 24, 1999, assigned to Atlantic Aerospace Corporation. This patent describes a method of tuning a patch antenna by using RF switches to connect or disconnect a series of tuning stubs. The presently disclosed antenna provides several advantages over this design. Since the present antenna uses a slot for the fundamental element, it is less sensitive to the position of the bias circuits. Furthermore, the disclosed design adds several features such as the ability to tune the polarization and the pattern, in addition to the frequency.

(6). Trent Jackson, William McKinzie, James Lilly, Andrew Humen, ""Tunable Microstrip Patch Antenna and Control System Therefore", U.S. Pat. No. 6,061,025, May, 9, 2000, assigned to Atlantic Aerospace Corporation. This patent is basically the same or very similar as the previous patent by some of the same authors.

(7). Jeffrey Herd, Marat Davidovitz, Hans Steyskal, "Reconfigurable Microstrip Array Geometry which Utilizes Microelectromechanical System (MEMS) Switches", U.S. Pat. No. 6,198,438, Mar. 6, 2001, assigned to The United States of America as represented by the Secretary of the Air Force. This patent describes an array of patch antennas which are connected by RF MEMS switches. The device provides a tunable antenna which is tuned by selectively turning on or off various switches to connect the patches together. Larger or smaller clusters of patches will create antennas operating at lower or higher frequencies, respectively. One problem with this design is that it requires a large number of switches. A more significant problem is that it does not provide a way to eliminate the problem of interference between the DC feed lines and the RF part of the antenna.

(8). Gerard Hayes, Robert Sadler, "Convertible Loop/Inverted F Antennas and Wireless Communicators Incorporating the Same", U.S. Pat. No. 6,204,819, Mar. 20, 2001, assigned to Telefonaktiebolaget L. M. Ericsson. This patent describes an antenna incorporating MEMS devices which are used to tune the resonance frequency by selectively activating various portions of the antenna. One drawback of this design is that it is complicated to design, as each resonant section is built of a different type of antenna. Furthermore, it only allows for frequency tuning. The present design allows for polarization tuning or pattern tuning in addition to frequency tuning, and it performs these functions using a simple structure that is easy to design.

(9). Frank Schiavone, "Linear Polarized RF Radiating Slot", U.S. Pat. No. 4,367,475, Jan. 4, 1983, assigned to Ball Corporation. This patent describes a slot antenna having two open ends, in which the frequency of the slot antenna is determined by lumped elements placed within or around the slot. Our antenna improves upon this design by making it tunable through the use of RF MEMS switches. The present antenna provides a structure that is unlike both the closed-ended slots of traditional slot antenna designs, and also unlike this open-ended slot design. The present antenna is closed, but only by the MEMS switch, and thus forces all of the antenna current to pass through the switch.

(10). David Haub, Louis Vannatta, Hugh Smith, "Multi-layered compact slot antenna structure and method", U.S. Pat. No. 5,966,101, Oct. 12, 1999, assigned to Motorola. The patent in its prior art portion shows the concept of an open-ended slot antenna. The basic concept of the single open-ended slot antenna does not anticipate the ability to tune the antenna through the use of RF MEMS switches. The open-ended slot antenna shown in this prior art reference is typically one-quarter wavelength long. Our MEMS-tuned slot antenna is one-half wavelength long, like a conventional slot antenna, but the use of the open end forces the entirety of the antenna current to pass through the MEMS switch.

The disclosed antenna provides several important advantages over the prior art. These include (1) the use of RF MEMS switches which allow the antenna to have higher efficiency than other designs that use lossy varactors, (2) the ability to tune not only the frequency, but also the pattern or the polarization, (3) a simpler design than many of the alternatives, which requires very little fine-tuning or experimentation to arrive at the correct geometry, (4) the versatility to be used in a broadband (without cavity) or narrowband (with cavity) applications with little modification to the design. Previous attempts to provide tunable antennas, including MEMS tuned antennas, can be found in the prior art listed above. None of these examples have the simplicity or versatility of the present design. The most obvious MEMS tuned antennas include the MEMS tuned dipole or patch or an ordinary slot antenna. Each of these have drawbacks including interference from DC bias lines of the MEMS switches or a limited tuning range due to the geometry of the antenna. The present antenna, which preferably includes an open-ended geometry, forces all (or at least most) of the antenna current to pass through a closed MEMS switch, resulting in the greatest frequency tuning range. Prior art exists which describes open ended slot antennas; however, the present antenna functions like a conventional slot antenna, because it is really closed at both ends—one end may be closed by the continuous ground plane itself and the other end may be closed by a closed RF MEMS switch. Additionally, the position of the end which is closed by the closed RF MEMS switch is movable, because various MEMS switches can be closed can be disposed at various positions. This differs from previous attempts to achieve the same effect, because all previous attempts at MEMS tuned slot antennas were of the closed-closed design, which resulted in limited tunability. The present design solves this problem by using a closed-open design, where the open end is then actually closed by a MEMS switch and preferably by one of a plurality of MEMS switches. The particular MEMS switch which is closed of the plurality allows the frequency of operation of the slot antenna to be controlled.

BRIEF DESCRIPTION OF THE INVENTION

In one aspect, the present invention provides a slot antenna for receiving and/or transmitting a RF signal at a desired one of a plurality of center frequencies. The slot antenna includes at least one conductive sheet having a slot defined therein, the slot being longer than it is wide, the slot also having a first end which is electrically closed and a second end which is electrically open. A plurality of switch members are mounted along the slot, each of the plurality of switch members acting, when closed, to couple the at least one conductive sheet on one side of the slot to the at least one conductive sheet on a second side thereof. A feed point is provided for coupling an RF signal to and from the at least one conductive sheet, the feed point being disposed adjacent the slot at a location which is nearer to the first end than it is to a closer or closest one of the plurality of switch members. The plurality of switch members are closable in a controlled manner to change a desired center frequency at which the slot antenna is to operate.

In another aspect, the present invention provides a cavity backed slot antenna for receiving and/or transmitting a RF signal at least at a desired one of a plurality of different frequencies, the slot antenna comprising at least one conductive sheet having a first slot defined therein, the first slot being longer than it is wide, the first slot having at least one open end which is electrically closable by MEMS switch devices bridging the slot, the slot having a cavity disposed behind it, the cavity being defined by (i) said at least one conductive sheet having the first slot defined therein, (ii) another conductive sheet spaced from said at least one conductive sheet having the first slot defined therein and (iii) sidewalls coupling said at least one conductive sheet having the slot defined therein to said another conductive sheet, at least one of said sidewalls being disposed adjacent said at least one open end of said slot, the at least one of said sidewalls having a gap therein which aligns with said at least one open end of said slot. The MEMS switch devices include a first plurality of switch members mounted along the first slot, each of said first plurality of switch members acting, when closed, to couple at least one conductive sheet on one side of said slot to the at least one conductive sheet on a second side thereof. A feed point is provided for coupling an RF signal to and/or from the at least one conductive sheet, the feed point being disposed adjacent the slot. The plurality of switch members are closable in a controlled manner to change the resonance frequency at which the slot antenna receives and/or transmits the RF signal.

In yet another aspect, the present invention provides a method of making a slot antenna comprising the steps of: (1) forming a longitudinal slot in an electrically conductive member, the longitudinal slot meeting at least one edge of the electrically conductive member to thereby define an open end of said slot, the slot having another end remote from said open end and (2) disposing a series of MEMS switches along said slot and nearer its open end that its remote end, the series of MEMS switches coupling one side of the slot to an opposite side thereof when closed.

In still yet another aspect, the present invention provides a method of making a slot antenna capable of operating at a plurality of different operating frequencies, the method comprising the steps of: (a) forming a longitudinal slot in an electrically conductive member; and (b) disposing a plurality of MEMS switches along said slot, the plurality of MEMS switches coupling one side of the slot to an opposite side thereof when closed, the longitudinal slot having at least one end which is electrically closed by at least a selected one of a plurality of MEMS switches to operate at a selected one of said plurality of operating frequencies, the electrically conductive member providing an electrically conductive route in parallel with said at least a selected one of a plurality of MEMS switches which route is at least one-quarter of a wavelength long at said selected one of said plurality of operating frequencies.

DESCRIPTION OF THE DRAWINGS

FIG. 1 is a plan view of a slot antenna in accordance with the present invention which helps convey the basic concepts behind the preferred embodiments of the present invention;

FIG. 2 depicts an alternative slot antenna structure which can be constructed using a slot antenna and MEMS switches, but which has less desirable performance compared to the slot antenna of FIG. 1;

FIG. 3A is a plan view of an embodiment of the antenna in accordance with the present invention;

FIG. 3B is a side sectional view of the embodiment of FIG. 3A;

FIG. 3C is an exploded plan view of a portion of antenna showing a MEMS switch and its carrier in greater detail;

FIGS. 4A and 4B are plan and side sectional views of an alternative embodiment to that of FIGS. 3A–3C;

FIGS. 5A and 5B are plan and side elevation views of an alternative, cavity-backed embodiment of a slot antenna in accordance with the present invention;

FIGS. 6A and 6B depict plan and side sectional views of an alternative, cavity-backed embodiment of the invention, but having a different feed arrangement than the embodiment of FIGS. 5A and 5B;

DETAILED DESCRIPTION

Figure 7:
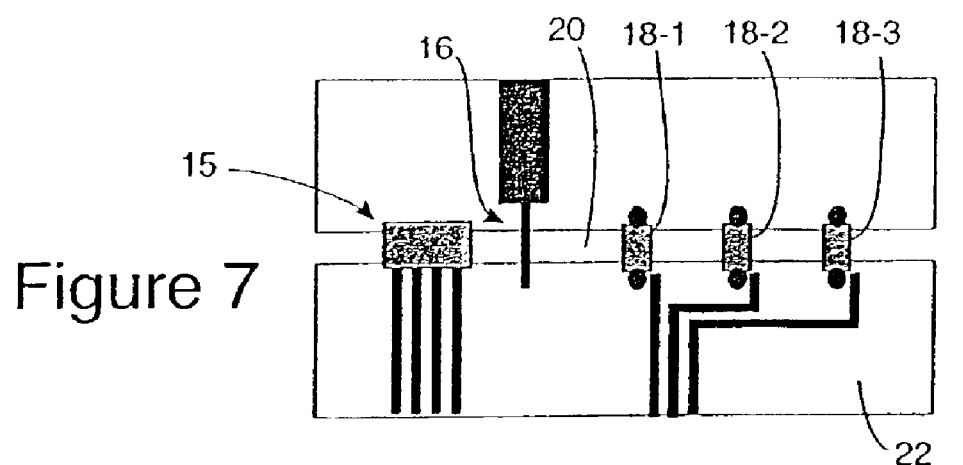
FIG. 7 shows the addition of another series of MEMS switches to provide for or to accommodate changes in the impedance of the antenna at its feed point.

A MEMS tuned slot antenna has several applications in the areas of frequency-tunable antennas, diversity antennas, smart antennas, and phased arrays. In its most basic form (see FIG. 1), this invention consists of a slot antenna 10 which is open at one end 12 and closed at the other end 14. The antenna has a feed point 16 near the closed end 14 of the slot 20. The location of the feed point 16 depends on the antenna geometry, but is typically disposed a distance D much less than a wavelength, usually on the order of one-eighth to one-tenth wavelength, from the closed end 14 of the slot. Between the feed point 16 and the open end 12 of the slot are disposed a series of RF MEMS switches 18-1, 18-2, 18-3 . . . which can be opened or closed by voltages applied to control lines 24-1, 24-2, 24-3 . . . (see FIG. 3). The MEMS switches 18-1, 18-2, 18-3 bridge the slot 20. By opening and closing the MEMS switches 18-1, 18-2, 18-3 . . . , one can vary the effective length of the slot 20, and thus tune the resonance frequency of the slot antenna. The antenna 10 is close to one-half wavelength long at the lowest desired resonance frequency. The MEMS switches 18-1, 18-2, 18-3 . . . are placed at various locations along the slot 20, those locations being determined by the desired frequencies at which the slot antenna will operate, with the distances D1, D2, D3, . . . from the shorted end 14 to each MEMS switch 18-1, 18-2, 18-3 . . . being approximately one-half wavelength at each desired resonance frequency. The feed point 16 is placed a distance D from the closed end 14 and between the closed end and the first MEMS switch 18-1, and can take a variety of forms including microstrip, coax, or other types. The distance D is typically much less than a wavelength, usually on the order of one-eighth to one-tenth wavelength. The slot 20 itself is cut into or otherwise formed in a conductive ground plane or surface 22, only a portion of which is shown here. The ground plane 22 may be a large surface, which may be many wavelengths in each dimension in the plane of the ground plane. The ground plane 22 may be part of a vehicle or airplane, such as its exterior surface. It may also be very small, as in the printed circuit board of a portable handset device such as a cellular telephone or other communications device. For very small antennas 10, the size of the surrounding ground plane will have some effect on the resonant frequency of the slot 20, however, this effect should not be great.

The slot 20 is typically on the order of 1 mm wide, but its width is not critical. There is a very slight dependence of the bandwidth of the antenna 10 based on the width of the slot 20, with increasing widths producing increasing bandwidths, but this effect is usually so small as to be unmeasurable. Theoretically, wider slots 20 would produce wider bandwidths, but if the slot 20 is made too wide, it will not be feasible to tune it with the tiny MEMS switch without having to significantly change the geometry.

At first glance, this invention may appear obvious in light of the prior art noted above. However, as will be explained here, it is in fact quite novel and could not be easily made using the standard antenna types listed above, combined in the most natural way with RF MEMS switches. One way of using MEMS switches to create a tunable antenna is to combine the switches with the antenna in such a way that they adjust some dimension that controls the resonant frequency of the antenna. Several examples of structures that have been tried include dipole antennas in which the MEMS switches adjust the length of the dipole, patch antennas in which the MEMS switches tune the length of the patch, and slot antennas in which the MEMS switches vary the length of the slot. Each of these has drawbacks: In the case of the dipole, the required DC bias lines cause significant interference with the dipole itself, resulting in unpredictable radiation patterns. In the case of the patch, the antenna itself is so strongly resonant that it is difficult to significantly detune the patch without a large number of MEMS switches covering a broad area. Also, the DC bias lines cause a similar problem with the patch to that which occurs with the dipole. The slot appears to be a good candidate because the DC bias lines can be printed in close proximity to the metal ground plane surrounding the antenna, and thus can cause very little interference. However, the standard slot antenna suffers from a significant drawback in that the current path surrounding the slot has extremely low impedance. The MEMS switches, because of their small size, have a small but finite inductance. This finite inductance is shorted by the much lower impedance path around the outside the slot, and a very small fraction of the current travels through the MEMS switch. The result is that the tuning range of the antenna can be significantly impaired. This geometry is shown in FIG. 2 where the current lines are depicted by the curved lines with arrowheads. More current heads around the closed end 14 than goes through the closed switch 18. The net result is that the effect of the switch is only partial. By opening one end 12 of the slot 20 and placing the feed point 16 between the closed end 14 and the MEMS switches 18, as shown in FIG. 1, one can force all of the antenna current to pass through the particular MEMS switch 18 which is closed. The result is that antenna 10 is extremely tunable and very simple to design. This may appear obvious considering the prior art teaching of Haub, et. al., however, in that design the open ended slot is used in a different way. By opening one end of the slot, one may reduce its length by half, making it one-quarter wavelength long instead of the usual one-half wavelength. This is because the standing wave formed in such a slot will have a node at the closed hand, and an antinode at the open end. If one were to try to tune such an antenna using a MEMS switch, the most natural way is put the switch near the closed end, where they would adjust the location of the node in the standing wave similar to the effect described above with reference to FIG. 2. Putting the MEMS switches near the open end is not a natural choice because this would place a node at a place calling for an antinode. Thus, the embodiment of FIG. 1 is quite different from that which one would arrive at by a natural combination of Haub's antenna with RF MEMS switches. In the embodiment of FIG. 1, the slot antenna 10 acts as an ordinary one-half wavelength slot, and the open end 12 exists not as a means of tuning the antenna 10, but rather as a means for forcing the antenna current through the closed MEMS switch (18-1, 18-2 or 18-3), allowing for maximum tunability.

The number of MEMS switches 18 utilized is a matter of design choice. Three switches are shown in FIG. 1 and in several other figures, but it is to be understood that an arbitrary number of switches could be used, if desired.

The basic concept of this invention has been presented above. The rest of this disclosure will include discussions of the various ways of implementing this concept in a manufacturable structure. The invention is not limited to the examples given here, and many variations on the basic concept may be obvious to those skilled in the art of antenna design, once they appreciate the concept described above.

One way of making this antenna will now be described with reference to FIGS. 3A, 3B and 3C. In this embodiment of the invention, the MEMS switches 18 are mounted on a carrier 26, which may consist of a small, simple printed circuit board. The carrier is preferably formed of a composite polymer material such as Duroid or of a ceramic material. This printed circuit board 26 has two metal plated vias 28 which allow the switch 18 mounted on its top surface to have electrical access to the slot antenna ground plane 22 upon which the carrier 21 is mounted, by conducting current in the vias 28 through the carrier 26 to the ground plane 22. In order to close the switches 24 with great simplicity, a single DC bias or control line 24 is preferably used. In order to accomplish this end, one of the two RF ports 18*a* of the MEMS switch 18 should also serve as the DC signal ground. This is shown in FIG. 3C, where one of the two vias 28-1 is wire bonded (see wires 19) to two locations on the switch. These two locations to which the common via 28-1 is wire bonded represent one RF port 18*a* and one DC port 18*b*. The other via 28-2 is only wire bonded to one location 18a on the switch, and serves only as an RF port. The remaining DC port 18b on the switch is wire bonded to the single DC bias or control line 24. Thus, the DC circuit consists of the DC bias or control line 24, the DC portion of the MEMS switch (accessed via ports 18b), one of the vias 28, and the ground plane 22 of the slot antenna itself 10. The RF circuit consists of the feed (which, in this embodiment, is provided by a coaxial cable 30), the slot 20 in the ground plane 22, and the RF portion of the MEMS switch 18 which is accessed via ports 18a and the two vias 28 in the carrier. This construction technique (using the carrier 26) allows the antenna 10 to be designed and built independently of the structure that supports the MEMS switch 24. Thus, the antenna 10 may be built of stamped sheet metal, printed circuit boards, or any other metal structure that suits the design. The MEMS switch 24 mounted on the carrier 26 can then be placed after fabrication of the slot 20, allowing for fine-tuning if necessary. The carrier 26 may be connected to the regions adjacent slot 20 using conductive epoxy, or solder. Using this technique, the slot 20 may also be entirely devoid of solid material, as would be the case for stamped sheet metal.

In FIG. 3A each switch 18 is shown on a separate carrier 26. Alternatively, the switches 81-1, 18-2, 18-3, . . . could all be mounted on a common carrier as opposed to on individual carriers 26. The use of individual carriers is preferred since that provides greater control in positioning the switches longitudinally along slot 20.

An alternative construction technique will now be described with reference to FIGS. 4A and 4B. In this embodiment the MEMS switches 24 are mounted directly to an insulating top surface or layer 21 which preferably overlays ground plane 22. The MEMS switches 24 are connected on either side of the slot by vias 28 which pass through the top surface 21. The DC bias circuit is formed in the same way as in the embodiment of FIGS. 3A–3C. In this case, the feed is shown as a printed microstrip line 31 which connects to the far side of the slot 20 by a via 29. The entire structure is a single multi-layer printed circuit board. The feed is a microstrip line 31 printed on the top layer 21, and connected to the opposite end of the slot 20 preferably through a single metal plated via 29. The MEMS switches 24 are also mounted directly on the top layer 21 and are connected to opposed sides of the slot 20 using pairs of metal plated vias 28 in a manner similar to that described in with reference to FIGS. 3A–3C. The DC bias lines 24 are similarly printed on the top layer of the printed circuit board, and are connected in to the MEMS switches 18 in a manner like to that described with reference to FIGS. 3A–3C.

Until now, only a freestanding slot antenna has been described. However, this design is also amenable to making a cavity backed slot antenna such as the antenna shown in FIGS. 5A and 5B. The use of a cavity 32 behind the slot antenna has the advantage that the slot 20 may then be mounted directly adjacent to a large metal ground plane, with no openings cut in that ground plane. This is often a requirement, as in the case of a metal skinned vehicle such as an automobile, for example. This is a benefit, because, in some cases, the designer may want to put an antenna on top of a large continuous ground plane such as the roof of the vehicle. If one makes the slot 20 part of a metal cavity 32, then you can place this cavity 32 on a metal surface, such as the roof of a vehicle, without shorting out the antenna. The use of the cavity 32 also limits the instantaneous bandwidth of the antenna, which may be an advantage or disadvantage depending on the application. As a rough design guide, the width of the cavity should typically be around one-half wavelength at the desired frequency, divided by the refractive index of the material filling the cavity. However, this is a very loose rule, and the cavity can be made at least a factor of two smaller than this without significant negative effects. Thus, a cavity 32 having a particular size can serve an antenna which is tunable over a very broad range.

A cavity antenna normally has metallic sidewalls 35 along each of its edges. However, if a metallic sidewall 35 covered the side of the antenna of FIGS. 5A and 5B adjacent where slot 20 contacts the edge, the sidewall immediately adjacent the slot 20 would act as a current path making the MEMS switches 18-1, 18-2, 18-3 that much less effective (essentially the problem described with reference to FIG. 2 would reappear). Therefore, the sidewall 35 adjacent where the slot 20 contacts the edge is opened up with a gap 39 having a width 37 to increase the length of the current path around the slot 20 at the edge of cavity, thereby increasing the effectiveness of the MEMS switches 18-1, 18-2, 18-3. The width 37 of the gap 39 should be sufficiently long that the current path in parallel witch a closed one of the MEMS switches 18 is approximately one-quarter wavelength long (or longer) for the operating frequency of the antenna with the closed one of MEMS switches 18.

The cavity 32 backed slot antenna can be fed using a microstrip 31 as shown in FIG. 5A, or an offset coaxial probe 34 as shown in FIG. 6A. Opening 33 in surface 21 (see FIG. 6A) facilitates soldering (or otherwise connecting) the center conductor of the coaxial 34 to surface 22'. The ground shield of the coaxial probe 34 is then coupled to the back plane 36. Surface 22' forms a portion of the ground plane for the antenna and since the cavity backed slot antenna is typically mounted on an electrically conductive surface (not shown—but such as the exterior metal surface of a vehicle) that electrically conductive surface also provides a ground plane for the antenna.

The feed point 16 impedance is preferably adjusted to 50 ohms (a common impedance used in antenna systems—other impedances can be used, of course) by adjusting its location along the slot 20. Typically, the feed point 16 can be placed a distance equal to $\frac{1}{10}$ to $\frac{1}{5}$ of a wavelength from the shorted end and the position can be adjusted quite easily within the range to find an impedance match.

In most cases, the feed point 16 can be placed at a single fixed distance D from the closed end 14 of the slot 20 and it can serve a very broad range of resonance frequencies. However, if the desired range of frequencies is extremely broad, or if the instantaneous bandwidth is very narrow as would be the case for a very thin cavity, some adjustment of the feed location may be necessary. This can be accomplished as shown in FIG. 7. In this embodiment the MEMS switches 18-1, 18-2, 18-3 that provide the frequency tuning are the same as those described above with reference to the previously described embodiments. However, a second series of closely spaced MEMS switches 15 have replaced the closed end 14 of the slot 20. This allows for adjustment of the location of the effective slot end associated with a closed one of the group of MEMS switches 15. The slot end adjusting switches 15 are nearer the feed point 16 than are the frequency adjusting switches 18. The slot end adjusting switches 15 account for possible impedance mismatches which may occur with a very broad tuning antenna or a very highly resonant antenna by effectively moving the closed end 14 of the slot 20 longitudinally along the slot 20. If the embodiment of FIG. 7 is formed without a cavity (such as cavity 32 shown in FIG. 5B) then the surface 22 is segmented into two portions by the slot since the slot 20 transverses the surface 22 in this embodiment. In two portions are preferably supported by a dielectric substrate (such as substrate 21 depicted in the embodiment of FIG. 4B) which substrate is not shown in FIG. 7.

Figure 8:
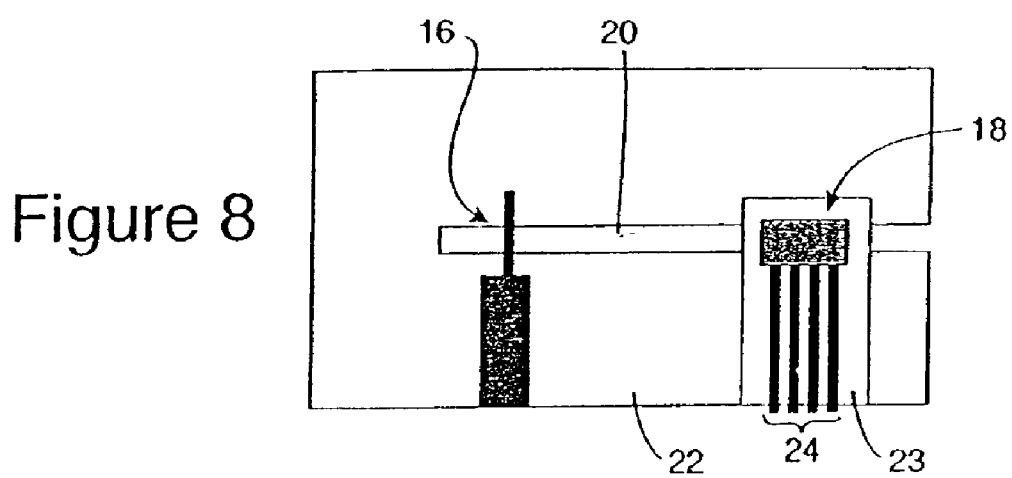
FIG. 8 depicts an embodiment where multiple closely-spaced MEMS switches are used for phase tuning and possibly for fine-tuning of the antenna resonance frequency.

Another embodiment of this invention is shown in FIG. 8. In this case, a group of MEMS switches 18' are very closely spaced together (there are located a very small part of a wavelength of the frequency of the antenna apart) and are disposed near the open end of the slot 20 in substrate 22. This allows the slot 20 to be tuned over a very small fraction of its bandwidth. Opening and closing the individual switches in unit 18' causes a variation in the phase of the radiated wave, which can have applications in phased array antennas. In FIG. 8 the group has four MEMS switches in switch unit 18 as is indicated by the four control or bias lines 24 which leave switch unit 18. Of course, the number of individual switches used in switch unit 18' is a matter of design choice. The group of switches can be disposed on a small substrate 23 and the antenna can be made by basically the same techniques described previously with respect to FIGS. 3A–3C, except that the switches here are much more closely spaced together. As in the other embodiments, the conductive ground plane or surface 22 may be mounted on or with a dielectric surface 21 (see FIG. 4B for example).

Since the MEMS switches of the embodiment of FIG. 8 change the resonance frequency by much less than the bandwidth, the primary effect is to tune the phase of the radiation. The antenna element shown in FIG. 8 could be used, for example, as a basic antenna element of a phased array by replicating the phase-tuned slot on a one-dimensional or on two-dimensional lattice.

Yet another embodiment will now be described with reference to FIG. 9. In this embodiment, the slot 20 assumes the shape of a letter "L" and has its feed point 16 at its corner 17 of the "L". Two MEMS switches 38 are placed in the slot, one on each side of and very close to the feed point 16. By closing one of the two switches 38, the arm or section of the L-shaped slot 20 having the closed switch 38 will be shorted, while the other arm or section will be able to radiate and/or receive RF radiation. This has the effect of switching the polarization of the antenna between two different linear polarizations. This embodiment of the antenna can be used for polarization diversity, for example, in a portable handsets antenna. The lengths of the two slots 20 are preferably controlled by utilizing groups of MEMS switches 18, as has been previously described, in each arm or section of the L-shaped slot 20. The arm or section with an open switch 38 will radiate, while the closed switch 38 in the other arm or section serves as the shorted end 14 (see the discussion relating to FIG. 1) of the operating slot arm/section. The L-shaped slot may be considered as being two slots which happen to intersect.

Figure 9:
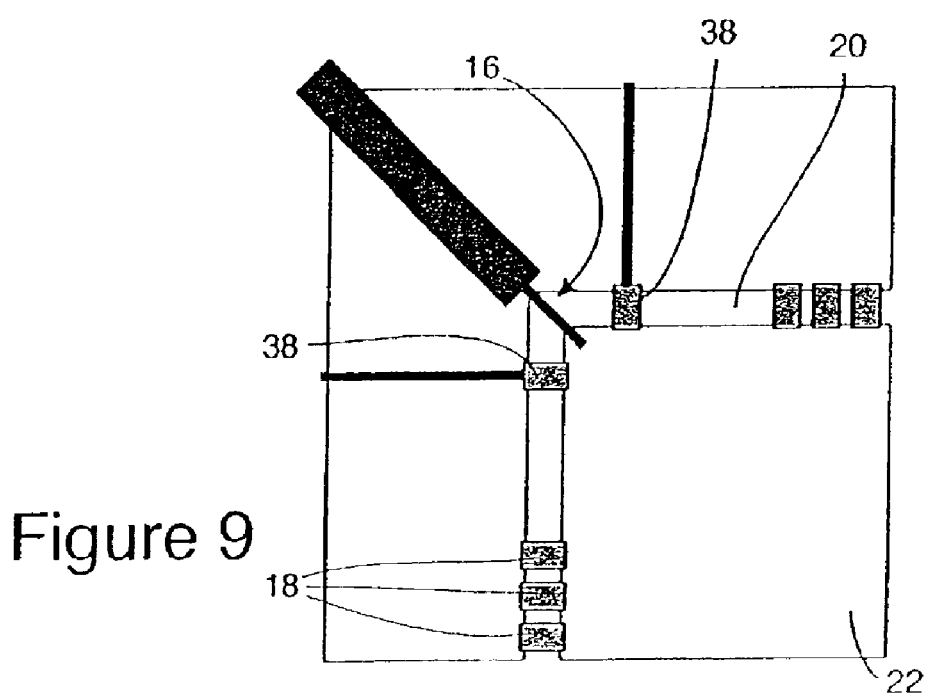
FIG. 9 depicts an L-shaped slot antenna embodiment.

The embodiment of FIG. 9 is somewhat similar to the embodiment of 7 in that the slot or slots 20 are depicted as completely traversing the conductive surface 22, splitting it into two portions. As previously mentioned, the ground plane 22 may be bigger than that suggested by these figures and thus the ground plane, in extending beyond the limits shown in the figures, may well close distal ends of the slot or slots. If the distal ends of the slot or slots are indeed closed in this fashion, then the distal end should be positioned sufficiently remotely from the MEMs switches 18 so that when a given MEMs switch 18 is closed, the current path provided by the short at the distal end should have a length (measured from the location of the given MEMs switch 18) of at least one quarter wavelength at the frequency which the antenna is then operated in order to cause a majority of the antenna current to route through the closed MEMs switch 18 as opposed to flowing via the short at the distal end of the slot. If the distal end of the slot is open as depicted in FIGS. 1, 3A, 4A, and 8, then the length of the aforementioned current path is at least one quarter wavelength long due to the length of the slot back to its closed end 14. If both ends of the slot are open as depicted in FIGS. 7 and 9, then the length of the aforementioned current path can be considered as be infinitely long through the conductive surface 22. A current path does exists, but it is via a MEMs switch 15 or 38 which acts like the closed end 14 of FIG. 1 when the MEMs switch is actuated.

Two separate antennas 10, each with its own slot 20 disposed orthogonally to the slot of the other antenna, may be used in combination. The switching of these antennas can then be controlled by switching the feeds to the feed points 16 of the two antennas or by the use of MEMS switches 38 to disable an associated slot 20 of one of the antennas, in order to provide antenna diversity.

Figure 10:
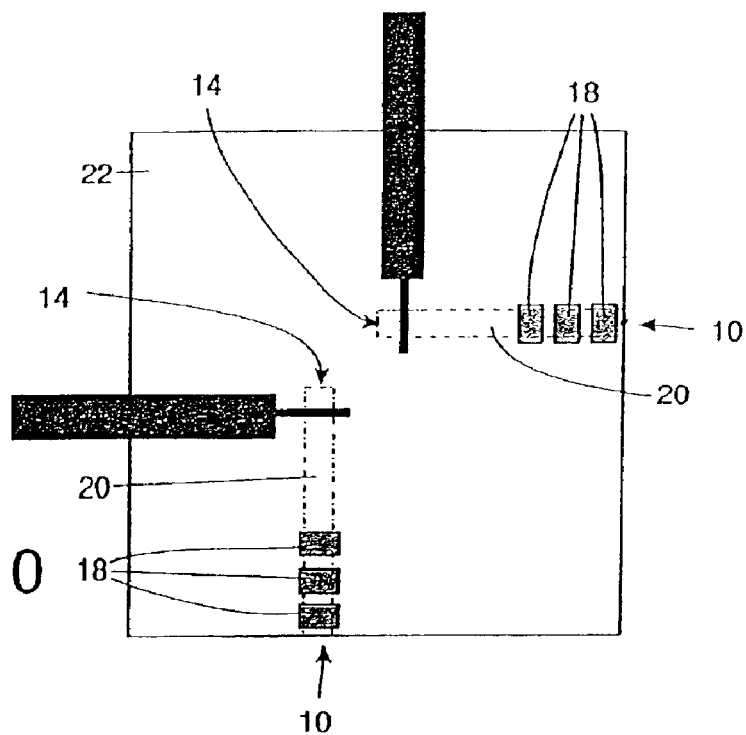
FIG. 10 depicts an antenna with two spaced apart slots arranged at 90 degrees to each other.

Multiple antennas 10 of the previously described embodiments can be used cooperatively together in a single ground plane. For example, as shown in FIG. 10, two antennas 10 can be arranged at a right angle to each other. By introducing a relative delay in the feed path to the feed point of one antenna compared to the other antenna, the antenna's polarization can be made circular. In that case each antenna would typically have a single MEMS switch which would be closed when the associated antenna 10 is utilized.

Alternatively, each antenna 10 of FIG. 10 can be fed with the same phase signal, but then by altering the frequency of one of the antennas slightly by closing a selected one of a group MEMS switches in each antenna, the slight frequency difference between the two antennas can be made to produce a 90-degree phase difference, as disclosed in U.S. patent application Ser. No. 09/829,192 filed Apr. 10, 2001 which discloses a crossed slot antenna capable of producing circular polarization. One can then alternately close a MEMS switch 18 in one of the two orthogonal slots 20 depicted in FIG. 10 to produce an antenna with switchable circular polarization.

Figure 11A:
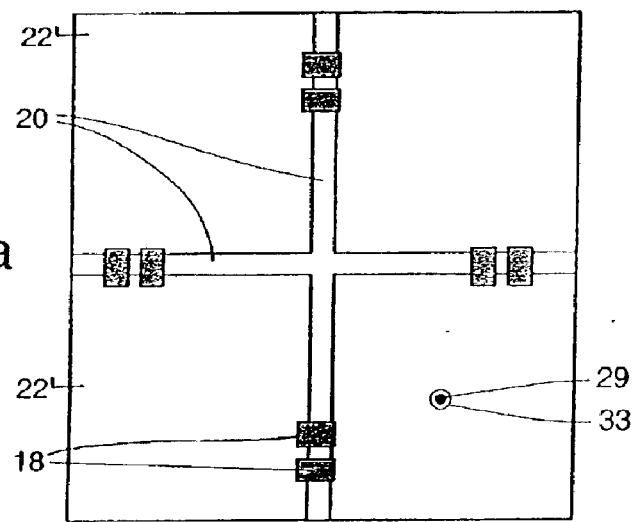
FIGS. 11a and 11b are plan and side views of an antenna with crossed slots and a cavity.
Figure 11B:
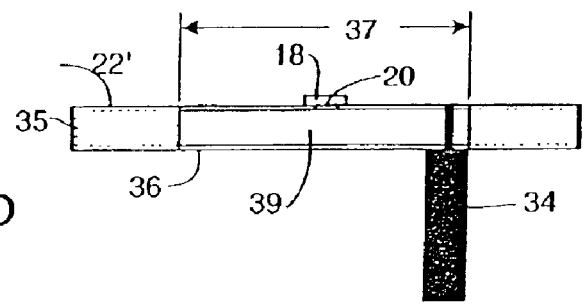

FIGS. 11A and 11B depict a crossed slot cavity backed antenna with crossed open-ended slots 20. Each slot has a series of MEMS switches at it ends having adjusting the resonance frequency of the associated slot. This embodiment is shown with a coax feed 34 similar to the embodiment of FIGS. 6A and 6B. The sidewalls 35 should have a gap 39 with a width 37 therein adjacent where the slots 20 intersect the sidewalls 35 in order to increase the length of the current path adjacent the ends of the slots 20 to increase the effectiveness of the MEMS switches 18. Alternately, the cavity could be increased in size so that it is sufficiently large and the slots sufficiently long, so as to provide the same effect. In either case, the total current path which would tend to bypass the MEMS switches, whether it is represented by an additional region of the slot or by an opening in-the cavity, should be on the order of ¼ wavelength.

The antenna of FIGS. 11A and 11B could, of course, be made without the cavity by disposing the surface 22' on a dielectric support surface.

A number of embodiment have been disclosed. These embodiments may be formed either with or without cavities as desired. As previously mentioned, providing a cavity allows for a more narrow banded operation compared to doing without a cavity. If a cavity is used, the cavity is usually "filled" with a dielectric such a solid dielectric material, a gas (for example, air) or even a vacuum.

These ideas can be combined together or combined with other techniques and thus it is to be expected that many other designs will be apparent to those skilled in the art of antenna design which will utilize the teachings contained herein.

Test Results

Figure 12:
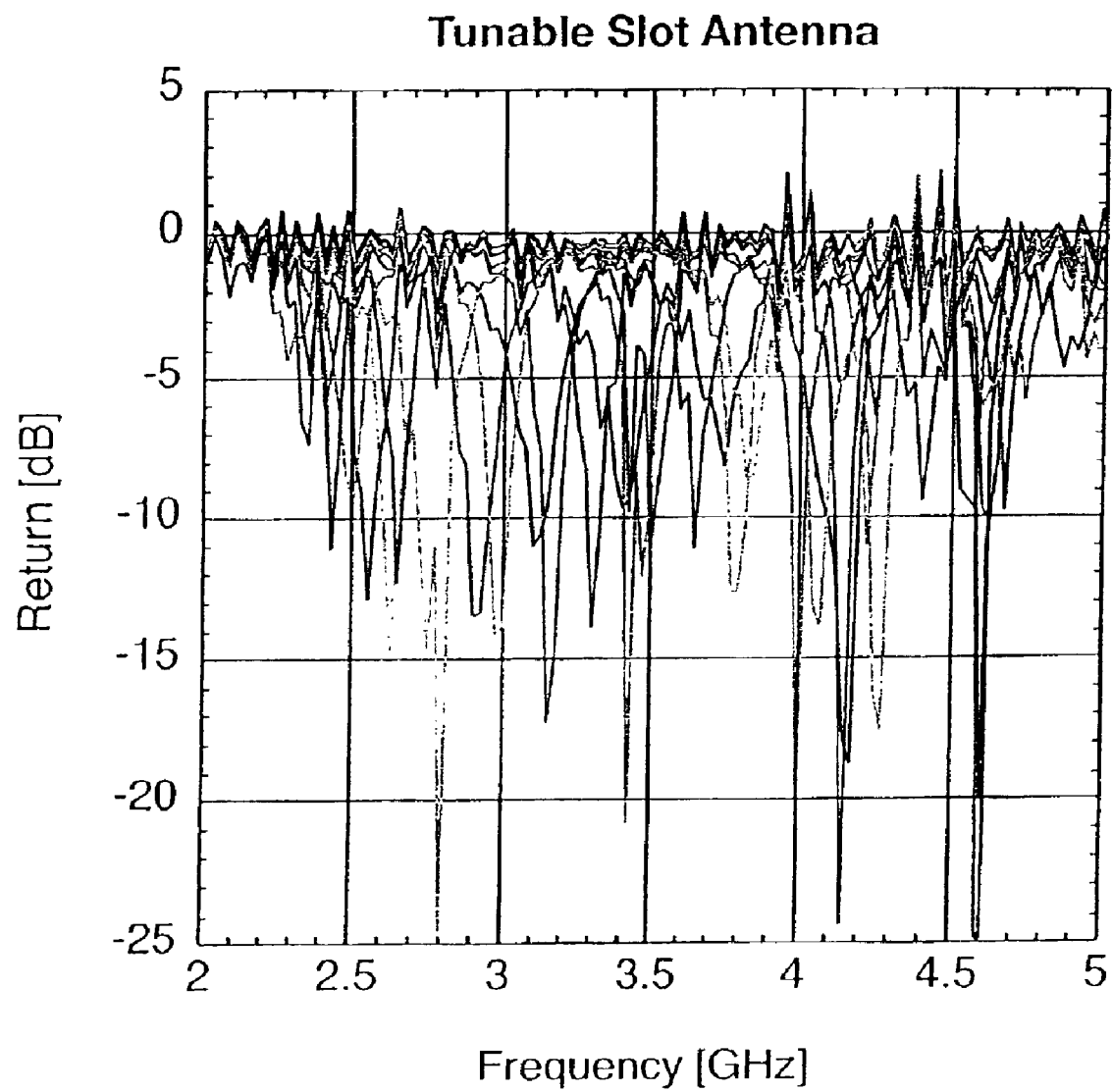
FIG. 12 provides a plot showing all of the various frequency states produced by tuning a particular open-ended, cavity-backed slot antenna over a length from 2.5 cm to 10 cm, the plots being superimposed here to show the broad range of the frequency tuning.
Figure 13:
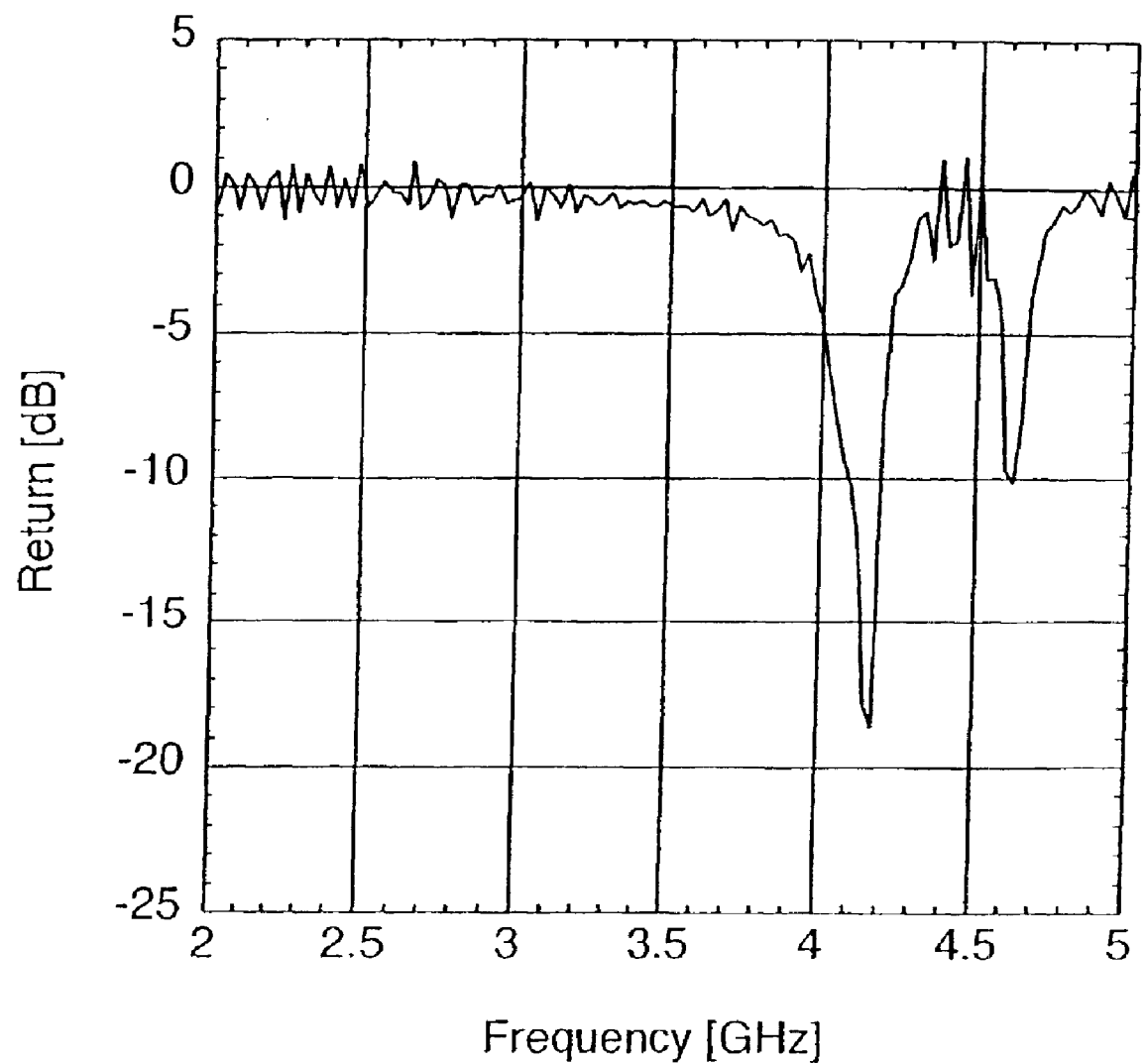
FIG. 13 depicts a single state in which the slot 2.5 cm long, where the primary radiation mode is at 4.1 Ghz but the second peak, visible at 4.6 Ghz, is an orthogonal mode produced by the cavity disposed below the slot.
Figure 14:
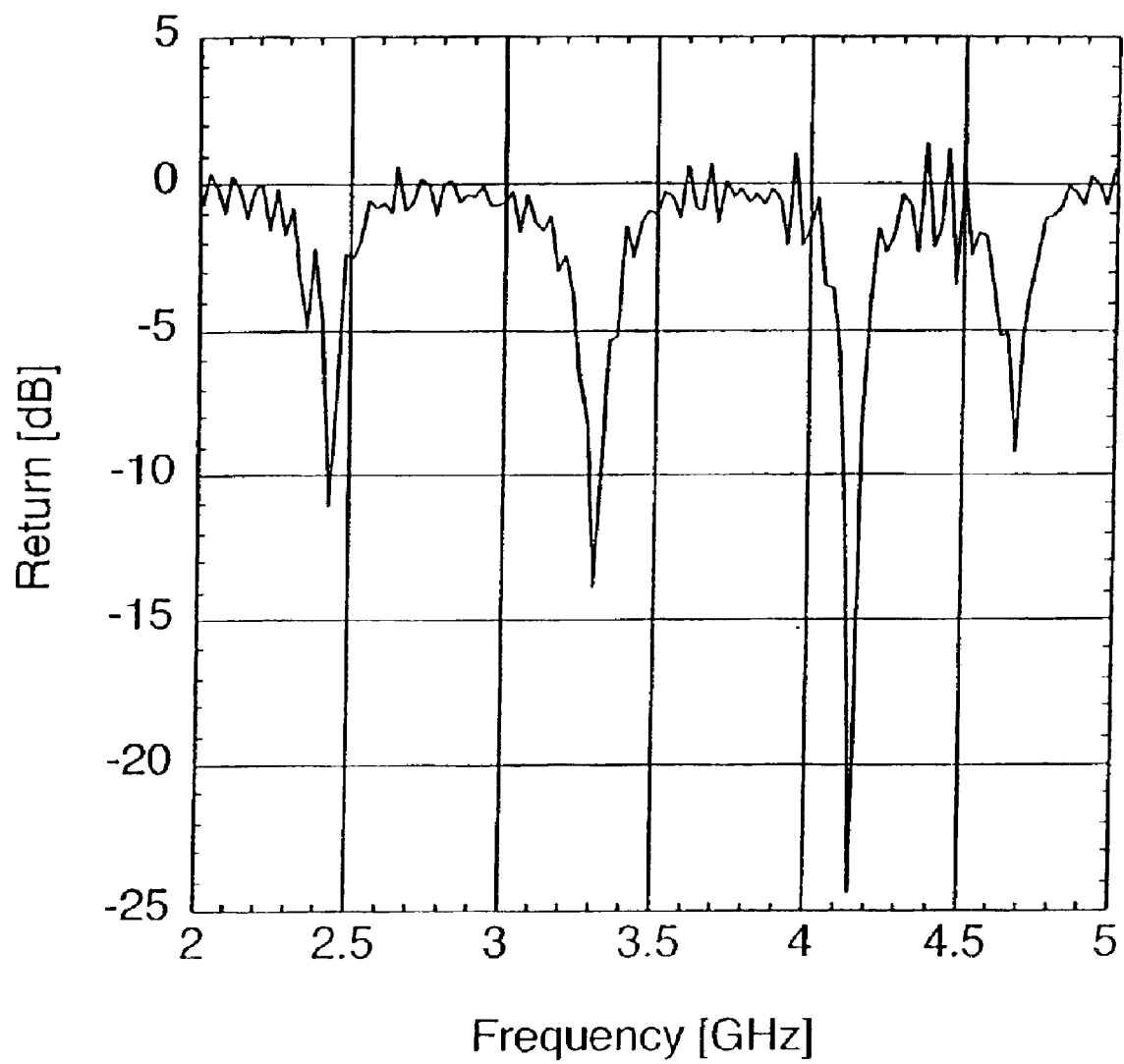
FIG. 14 depicts a state in which the slot is 8.25 cm long, where three primary modes are visible at 2.6 GHz, 3.3 GHz, and 4.2 GHz, which are tuned by adjusting the length of the slot—a fourth mode is again visible at 4.6 GHz, which is due to the cavity.

To substantiate the feasibility of the structures described above, an antenna was built consisting of a cavity backed slot, fabricated as a printed circuit board made of Duroid 5880. The back of the board was entirely metal, and the front was also formed of metal but had a slot 20 formed therein. The slot 20 was shorted at one end and open at the other end. A coaxial cable was used to feed the slot near its shorted end. The board measured 10 cm by 4.5 cm, and the feed was placed 8 mm from the shorted end of the slot 20. An array of gold bond wires was placed along the slot, shorting one side of the slot to the other, and simulating the presence of the MEMS switch. The first bond wire was placed 2.5 cm from the shorted and the slot, and the wires were spaced every 6 mm. One by one, the wires were removed, and the antenna was measured to document its return loss, and thus the quality of its input impedance match. The results of these measurements are compiled in FIG. 12. The antenna is tunable over a range of 2.4 GHz to 4.6 GHz using this technique. Two specific states of the antenna are shown in FIGS. 13 and 14. FIG. 13, in which the slot was 2.5 cm long, shows a primary peak at 4.2 GHz, and the secondary peak at 4.6 GHz. The primary peak represents the main radiation mode of the antenna, and it is this mode that is tunable. The secondary peak represents a different mode within the cavity, and this mode is not tunable. FIG. 14 shows the three main peaks, which consist of a first order mode at 2.4 GHz, a second order mode at 3.3 GHz, a third order mode at 4.1 GHz, and again a non-tunable mode at 4.6 GHz. The presence and location of this non-tunable mode will depend on the presence of the cavity 32, and the details of its geometry. The other modes can be tuned by adjusting the length of the cavity, by opening and closing the MEMS switches.

Figure 15:
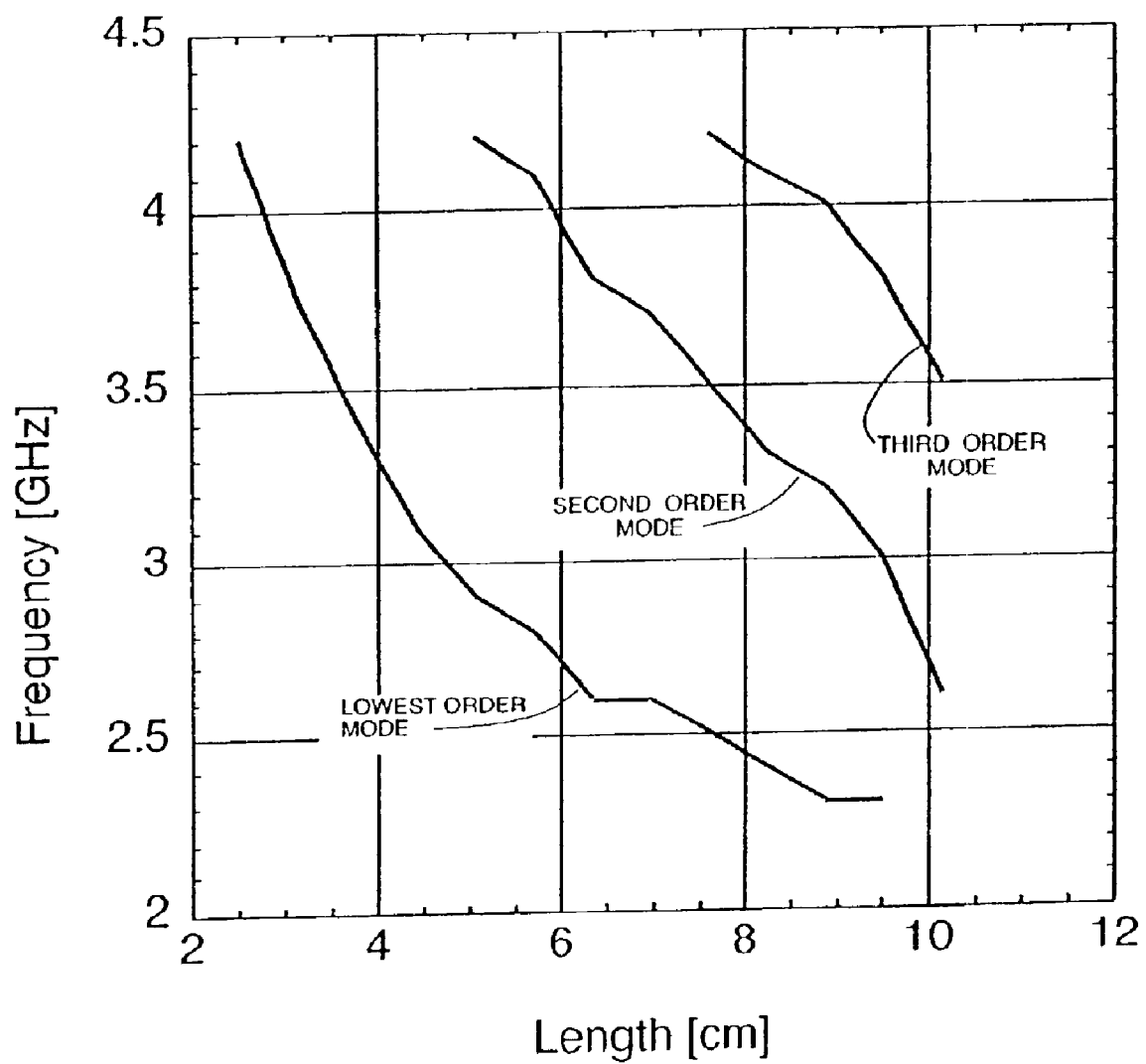
FIG. 15 provides a summary of the frequency of each mode as a function of slot length.

The lowest order resonance consists of the mode in which is single half wavelength fits across the length of the slot 20. The frequency of this mode may thus be determined from the length of the slot, and the effective index of refraction of the material on both sides of the slot 20. This mode produces a very broad radiation pattern, which is nearly omnidirectional, or semi-omnidirectional in the case of the cavity backed slot. The second order mode fits an entire wavelength within the slot. The third order mode fits three half wavelengths within the slot. With no cavity, the second and third order modes would thus be a factor of two, or three, respectively, greater than the first order mode. In the case of the cavity backed slot, all three modes are compressed toward the center frequency of the cavity, which is about 3.3 GHz in the case measured here. A plot of the frequency of each mode as a function of slot length is shown in FIG. 15. The lowest order mode is shown, the second order mode is shown, and the third order mode is shown in this figure. By appropriately choosing several switch positions, one may change the mode order while keeping the frequency the same. For example, to produce a first order mode and a second order mode at 3 GHz, the switch positions would be 4.75 cm and 9.5 cm. Switching between these two modes produces two different radiation patterns, which is useful for pattern diversity.

Figure 16:
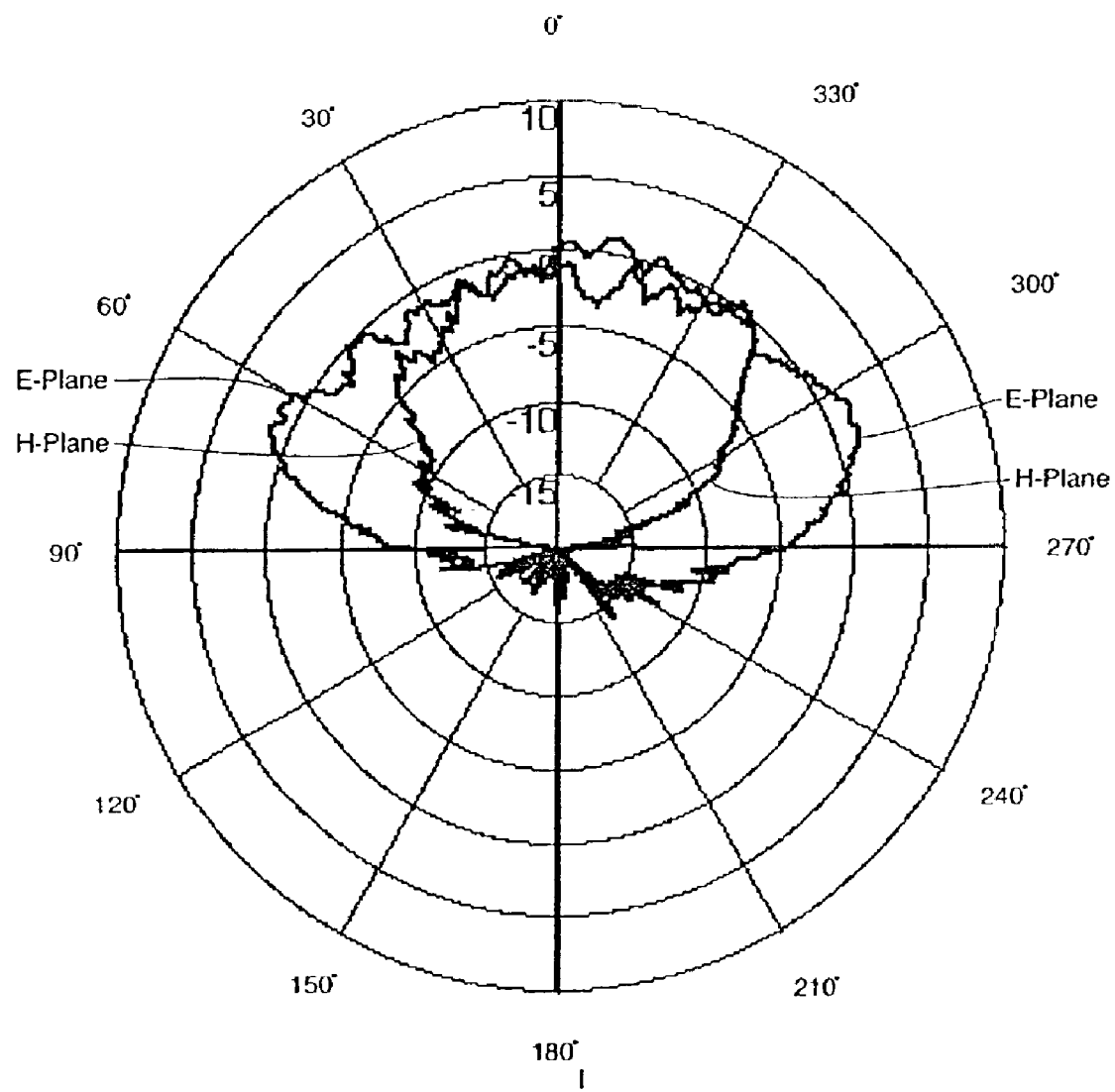
FIG. 16 depicts a graph of the radiation pattern of the lowest order mode, in which the slot is one-half wavelength long.
Figure 17:
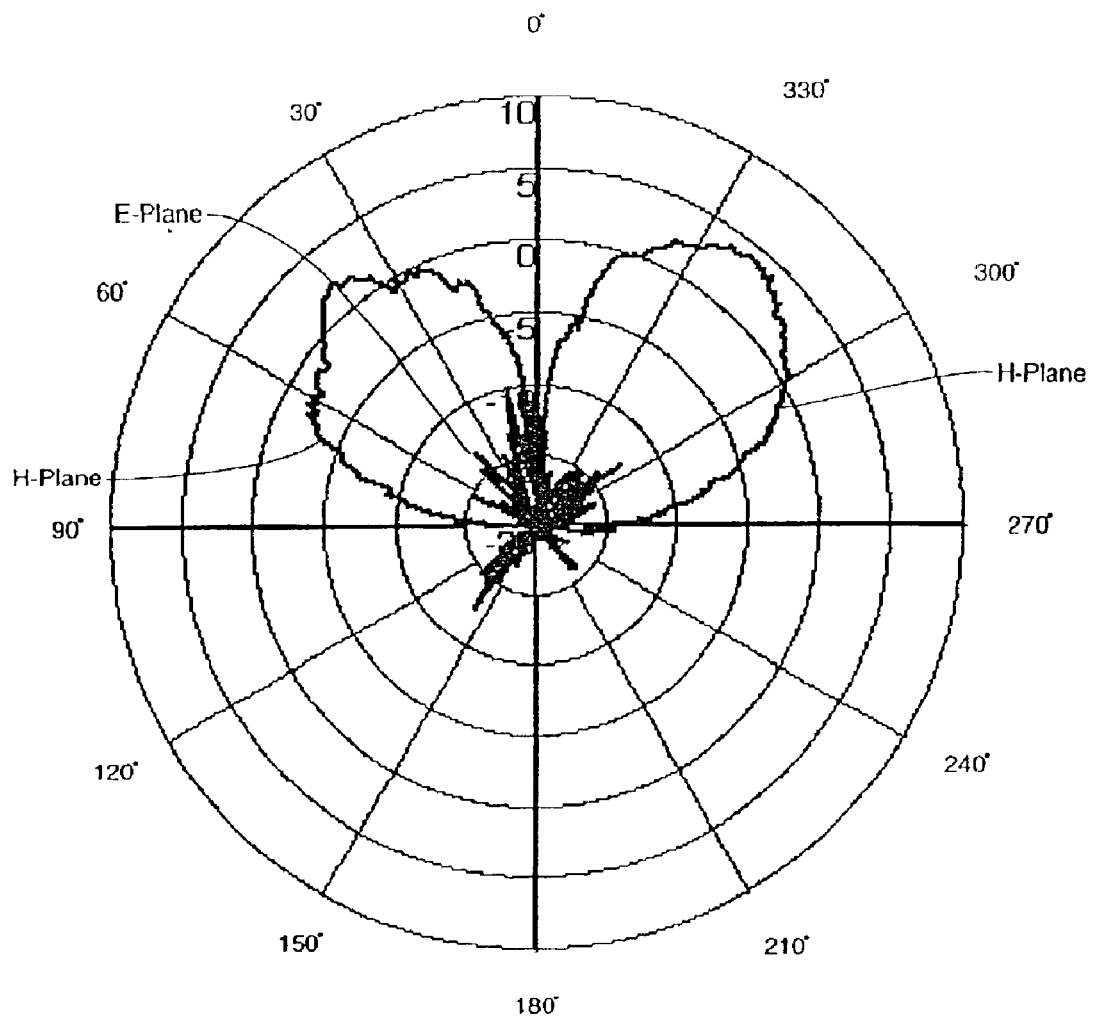
FIG. 17 The radiation pattern for a second order mode of the same slot antenna as in the previous figure—the pattern has a null along the E-plane, and two main lobes in the H-plane.

One application of the MEMS tuned slot antenna is for pattern diversity. Each mode produces a different radiation pattern, and by switching between these radiation patterns, a wireless system can achieve a greater signal to noise ratio, by taking advantage of diversity gain. An example of one way of switching between modes to achieve pattern diversity is shown in FIGS. 16 and 17. FIG. 16 shows the typical pattern for a lowest order mode of a cavity backed slot antenna. FIG. 17 shows the second order mode of the same antenna. Since the radiation patterns of the two modes are significantly different, switching between these two modes can provide two different views of the surrounding multipath environment, and provide a significant degree of diversity gain. Using the graph shown in FIG. 15, on can choose the positions of the MEMS switches so that both modes occur at the same frequency, which would be the most appropriate configuration for a modern wireless system.

FIG. 17 shows the radiation pattern for a second order mode of the same slot antenna as reported in FIG. 16. Here the pattern has a null along the E-plane, and two main lobes in the H-plane. By switching between this pattern and the one in the previous figure, one can achieve a significant amount of pattern diversity.

Some embodiments of the antenna have the slot or slots defined in a ground plane. Other embodiments of the antenna have the slot or slots defined in a conductive member or members which define a portion of a cavity. The cavity based embodiment has the advantage of being able to be conveniently disposed on top of a larger ground plane such as that provided by the outer metal surface of a vehicle (automobile, car, truck, airplane, missile, etc.). The embodiments which, as previously describe, have no cavities and be easily modified to include a cavity by following the teachings provided herein. In a similar fashion, the embodiment which, as described above, have cavities therein, can be modified to eliminate the cavities, if so desired. For example, consider the cavity-backed embodiment of FIGS. 11A and 11B. If the cavity is eliminated that means that the lower conductive surface and the sidewalls 35 disappear, leaving four conductive rectilinear elements connected by MEMS switches 18. The mechanical support provided by the cavity disappears, but some sort of mechanical support is desired to support the four rectilinear conductive surfaces. One way of supporting those surface (and hence their MEMS switches 18), is to dispose them on a Hi-Z surface of the type disclosed in the following patent application owned by UCLA: D. Sievenpiper and E. Yablonovitch, "Circuit and Method for Eliminating Surface Currents on Metals." U.S. provisional patent application serial No. 60/079,953, filed Mar. 30, 1998 and corresponding PCT application PCT/US99/06884, published as WO99/50929 on Oct. 7, 1999, the disclosures of which are hereby incorporated herein by reference. The sizes of the conductive elements forming the Hi-Z surface or surfaces should be sized so that their dimensions are much less that a wavelength of the highest desired resonance frequency of the antenna.

The Hi-Z surface of PCT application PCT/US99/06884, published as WO99/50929 on Oct. 7, 1999, could be used with any of the embodiments disclosed herein either by mounting the disclosed embodiment on a Hi-Z surface or by first removing the cavity before mounting on the Hi-Z surface.

In the disclosed embodiments of the slot antennas, each slot 20 has a physically open end which is electrically closed by means of MEMS switches 18 when at least one of those switches is closed. This assumes that the switches are normally open circuit switches. The switches 18 could alternatively be normally closed switches, which would have the effect of changing the sense of the how the control voltage would be applied.

The open end of the slots 20 are depicted as being physically open. If the slot is very long, the "open" end of the slot could be in fact physically closed, so long as the current path around the physically closed end were sufficiently long compared to the current path via the MEMS switch 18 such that the actuation of the MEMS switch 18 would have an appreciable effect on the frequency of operation of the slot antenna. In terms of FIG. 2, in order to have an appreciable effect, the closed end 14 would have to be many times father from the feed point 16 than is MEMS switch 18.

Having described the present invention in connection with certain embodiments, modification will now doubtlessly suggest itself to those skilled in the art. For example, a number of variations or embodiments of a basic concept have been disclosed. At the very minimum, those variations and embodiments can be combined in various ways depending on the features which a slot antenna is intended to have. As such, the invention is not to be limited to the disclosed embodiments and variations except as specifically required by the appended claims.

What is claimed is:

1. A slot antenna for receiving and/or transmitting a RF signal at a desired one of a plurality of different frequencies, the slot antenna comprising:
   (a) at least one conductive sheet having a slot defined therein, the slot being longer than it is wide, the slot having a first end which is electrically closed and a second end which is open;
   (b) a plurality of switch members mounted along said slot closer to the second end than to the first end thereof, each of said plurality of switch members acting, when closed, to couple the at least one conductive sheet on one side of said slot to the at least one conductive sheet on a second side thereof;
   (c) a feed point for coupling an RF signal to and/or from the at least one conductive sheet, the feed point being disposed adjacent said slot at a location which is nearer to said first end than it is to a closer or closest one of said plurality of switch members; and
   (d) the plurality of switch members be closable in a controlled manner to change a desired resonance frequency at which the slot antenna receives and/or transmits the RF signal.

2. The slot antenna of claim 1 wherein said plurality of switch members are disposed along said slot closer to one end of the slot than to another end thereof.

3. The slot antenna of claim 2 wherein said plurality of switch members are disposed along said slot closer to the second end of the slot than the first end thereof.

4. The slot antenna of claim 1 wherein the electrically closed end of the slot is formed by a portion of said at least one conductive sheet which physically closes said slot.

5. The slot antenna of claim 1 wherein the electrically closed end of the slot is formed by a controllable switch connected across said slot, which controllable switch, when in its closed position, connects said one side of the conductive sheet with the other side thereof at said first end.

6. The slot antenna of claim 5 wherein the controllable switch is one of a plurality of controllable switches arranged along said slot adjacent the first end thereof, said controllable switches being separately closable to change the location of said first end along said slot and thereby affect the impedance of the feed point.

7. The slot antenna of claim 1 wherein the slot has an L-shaped configuration having first and second orthogonally-disposed sections, the feed point being disposed adjacent a point where the two orthogonally-disposed sections meet, the first section having an end which is electrically closed when a controllable switch associated with the second section is closed and the second section having an end which is electrically closed when a controllable switch associated with the first section is closed, the first end of the slot moving between the controllable switch associated with the second section and the controllable switch associated with the first section in response to closures of the controllable switches associated with the first and second sections.

8. The slot antenna of claim 1 further including a cavity arranged adjacent said slot in said at least one conductive sheet.

9. The slot antenna of claim 1 wherein said plurality of switch members are mounted on a one or more dielectric carriers, said one or more dielectric carriers being mounted over said slot so that said plurality of switch members are thereby mounted along said slot.

10. A cavity backed slot antenna for receiving and/or transmitting a RF signal at least at a desired one of a plurality of different frequencies, the slot antenna comprising:
   (a) at least one conductive sheet having a first slot defined therein, the first slot being longer than it is wide, the first slot having at least one open end which is electrically closable by MEMS switch devices bridging the first slot, the slot having a cavity disposed behind it, the cavity being defined by (i) said at least one conductive sheet having the first slot defined therein, (ii) another conductive sheet spaced from said at least one conductive sheet having the first slot defined therein and (iii) sidewalls coupling said at least one conductive sheet having the first slot defined therein to said another conductive sheet, at least one of said sidewalls being disposed adjacent said at least one open end of said first slot, the at least one of said sidewalls having a gap therein which aligns with said at least one open end of said first slot;
   (b) the MEMS switch devices including a first plurality of switch members mounted along the first slot, each of said first plurality of switch members acting, when closed, to couple at least one conductive sheet on one side of said first slot to the at least one conductive sheet on a second side thereof,
   (c) a feed point for coupling an RF signal to and/or from the at least one conductive sheet, the feed point being disposed adjacent said first slot; and
   (d) the plurality of switch members be closable in a controlled manner to change the resonance frequency at which the slot antenna receives and/or transmits the RF signal.

11. The slot antenna of claim 10 wherein said first plurality of switch members are disposed along said first slot closer to a peripheral edge of said cavity than to said feed point.

12. The slot antenna of claim 11 wherein said first slot has two open ends which terminate at the peripheral edge of said cavity and further including a second plurality of switch members disposed along said slot closer a second open end of the slot than to said feed point.

13. The slot antenna of claim 12 further including a second slot having two open ends which terminate at the peripheral edge of said cavity, the second slot intersecting the first slot at a position which is at a midpoint of each of said first and second slots, the second slot having first and second pluralities of MEMS switch members arranged along said second slot closer to the open ends thereof than to said feed point.

14. The slot antenna of claim 10 wherein the slot has an electrically closed end remote from the open end thereof.

15. The slot antenna of claim 14 wherein the electrically closed end of the slot is formed by a portion of said at least one conductive sheet.

16. A method of making a slot antenna comprising:
(a) forming a longitudinal slot in an electrically conductive member, the longitudinal slot meeting at least one edge of the electrically conductive member to thereby define an open end of said slot, the slot having another end remote from said open end; and
(b) disposing a series of MEMS switches along said slot and nearer its open end that its remote end, the MEMS switches coupling one side of the slot to an opposite side thereof when closed.

17. The method of claim 16 wherein the other end of the slot also meets an edge of the electrically conductive member to thereby define a second open end of said slot and further including the step of disposing a second series of MEMS switches along said slot and nearer its second open end than its first mentioned open end, the second series of MEMS switches coupling one side of the slot to an opposite side thereof when closed.

18. The method of claim 16 wherein the slot has parallel side walls.

19. The method of claim 18 wherein the remote end of the slot is electrically closed by said electrically conductive member.

20. The method of claim 18 wherein the remote end of the slot is electrically closed by slot end adjusting switches, the slot end adjusting switches being disposed closer to a feed point of the antenna than are said series of MEMS switches.

21. The method of claim 16 wherein the remote end of the slot is electrically closed by said electrically conductive member.

22. The method of claim 16 wherein the remote end of the slot is electrically closed by slot end adjusting switches, the slot end adjusting switches being disposed closer to a feed point of the antenna than are said series of MEMS switches.

23. A method of making a slot antenna capable of operating at a plurality of operating frequencies, the method comprising:
(a) forming a longitudinal slot in an electrically conductive member; and
(b) disposing a plurality of MEMS switches along said longitudinal slot, the plurality of MEMS switches coupling one side of the slot to an opposite side thereof when closed, the longitudinal slot having at least one end which is electrically closed by at least a selected one of said plurality of MEMS switches to operate at a selected one of said plurality of operating frequencies, the electrically conductive member providing an electrically conductive route in parallel with said at least a selected one of a plurality of MEMS switches which is at least one-quarter of a wavelength long at said selected one of said plurality of operating frequencies.

24. The method of claim 23 further including:
(c) forming a second longitudinal slot in the electrically conductive member, the second longitudinal slot being disposed at a right angle to the first mentioned longitudinal slot; and
(d) disposing a second plurality of MEMS switches along said second longitudinal slot, the second plurality of MEMS switches coupling one side of the second slot to an opposite side thereof when closed, the second longitudinal slot having at least one end which is electrically closed by at least a selected one of said second plurality of MEMS switches to operate at a second selected one of said plurality of operating frequencies, the electrically conductive member providing a second electrically conductive route in parallel with said at least a selected one of said second plurality of MEMS switches which is at least one-quarter of a wavelength long at said second selected one of said plurality of operating frequencies.

25. The method of claim 24 wherein the second longitudinal slot intersects the first mentioned longitudinal slot.

26. The method of claim 24 wherein the first mentioned route and the second route are each infinitely long.

27. A slot antenna capable of operating at a plurality of operating frequencies, the slot antenna comprising:
(a) an electrically conductive member having a longitudinal slot defined therein; and
(b) a plurality of MEMS switches disposed along said longitudinal slot, the plurality of MEMS switches coupling one side of the slot to an opposite side thereof when closed, the longitudinal slot having at least one end which is electrically closed by at least a selected one of said plurality of MEMS switches to operate at a selected one of said plurality of operating frequencies, the electrically conductive member providing an electrically conductive route in parallel with said at least a selected one of a plurality of MEMS switches which is at least one-quarter of a wavelength long at said selected one of said plurality of operating frequencies.

28. The slot antenna of claim 27 further including:
(c) a second longitudinal slot in the electrically conductive member, the second longitudinal slot being disposed at a right angle to the first mentioned longitudinal slot; and
(d) a second plurality of MEMS switches disposed along said second longitudinal slot, the second plurality of MEMS switches coupling one side of the second slot to an opposite side thereof when closed, the second longitudinal slot having at least one end which is electrically closed by at least a selected one of said second plurality of MEMS switches to operate at a second selected one of said plurality of operating frequencies, the electrically conductive member providing a second electrically conductive route in parallel with said at least a selected one of said second plurality of MEMS switches which second route is at least one-quarter of a wavelength long at said second selected one of said plurality of operating frequencies.

29. The slot antenna of claim 28 wherein the second longitudinal slot intersects the first mentioned longitudinal slot.

30. A method of making a slot antenna comprising:
(a) forming a longitudinal slot in an electrically conductive member, the longitudinal slot meeting at least one edge of the electrically conductive member to thereby define an open end of said slot, the slot having another end remote from said open end; and
(b) disposing a series of MEMS switches along said slot and nearer its open end that its remote end, the MEMS switches coupling one side of the slot to an opposite side thereof when closed and thereby defining an active region of the slot between the closed end thereof and a closed one of the MEMS switches, the active region acting as an antenna to support radiation and/or reception of electromagnetic waves by said slot.

31. The method of claim 30 wherein the slot has straight side walls which are disposed parallel to one another.

32. The method of claim 30 wherein the remote end of the slot is electrically closed by said electrically conductive member.

* * * * *